US007280056B2

(12) United States Patent
 Puma

(10) Patent No.: US 7,280,056 B2
(45) Date of Patent: Oct. 9, 2007

(54) SIGMA-DELTA CONVERTER AND USE THEREOF

(75) Inventor: Giuseppe Li Puma, Bochum (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/473,602

(22) Filed: Jun. 23, 2006

(65) Prior Publication Data
US 2007/0008202 A1 Jan. 11, 2007

(30) Foreign Application Priority Data
Jun. 27, 2005 (DE) ...................... 10 2005 029 819

(51) Int. Cl.
*H03M 3/00* (2006.01)
(52) U.S. Cl. ......................... 341/76; 341/143
(58) Field of Classification Search .................. 341/76, 341/77, 143; 375/243
See application file for complete search history.

(56) References Cited

U.S. PATENT DOCUMENTS

| | | | | |
|---|---|---|---|---|
| 4,901,077 | A | * | 2/1990 | Christopher ................ 341/143 |
| 5,367,691 | A | * | 11/1994 | Johnson ....................... 708/710 |
| 5,563,535 | A | * | 10/1996 | Corry et al. ................. 327/105 |
| 6,188,345 | B1 | * | 2/2001 | McDonald et al. ......... 341/143 |
| 6,707,855 | B2 | * | 3/2004 | Patana ......................... 375/244 |
| 2003/0235261 | A1 | | 12/2003 | Patana |
| 2005/0225463 | A1 | * | 10/2005 | Rezeq et al. ................. 341/143 |

FOREIGN PATENT DOCUMENTS

DE 42 94 754 C1 11/1995
WO WO 2005/015746 A2 2/2005

OTHER PUBLICATIONS

"Delta-Sigma Data Converters", Steven R. Norsworthy et al., IEEE Press, 1997, 25 pgs.
"Delta-Sigma Modulation in Fractional-*N* Frequency Synthesis", Tom A.D. Riley, Miles A. Copeland and Tad A. Kwasniewski, IEEE Journal of Solid-State Circuits, vol. 28, No. 5, May 1993, pp. 553-559.
"All-Digital PLL and GSM/Edge Transmitter in 90 nm CMOS", Robert Bogdan Staszewski et al., IEEE International Solid-State Circuits Conference, Digest of Technical Papers, Feb. 2000, 4 pgs.

* cited by examiner

*Primary Examiner*—Howard L. Williams
(74) *Attorney, Agent, or Firm*—Eschweiler & Associates, LLC

(57) ABSTRACT

A sigma-delta converter has a signal input for receiving a data word. A clock signal input is designed to supply a clock signal. The sigma-delta converter includes a first clocked-operation accumulator stage whose input side is connected to the signal input, and at least one second clocked-operation accumulator stage connected in series with the first accumulator stage, with its input side coupled to an accumulator output of the first accumulator stage. The sigma-delta converter is configured to process the data word upon each clock signal only in one accumulator stage in the first and the at least one second accumulator stage, and output the processed data word at the accumulator output of the one accumulator stage. As a result, a time-critical response during signal processing is limited just to the accumulator stage which is currently processing the data word.

15 Claims, 6 Drawing Sheets

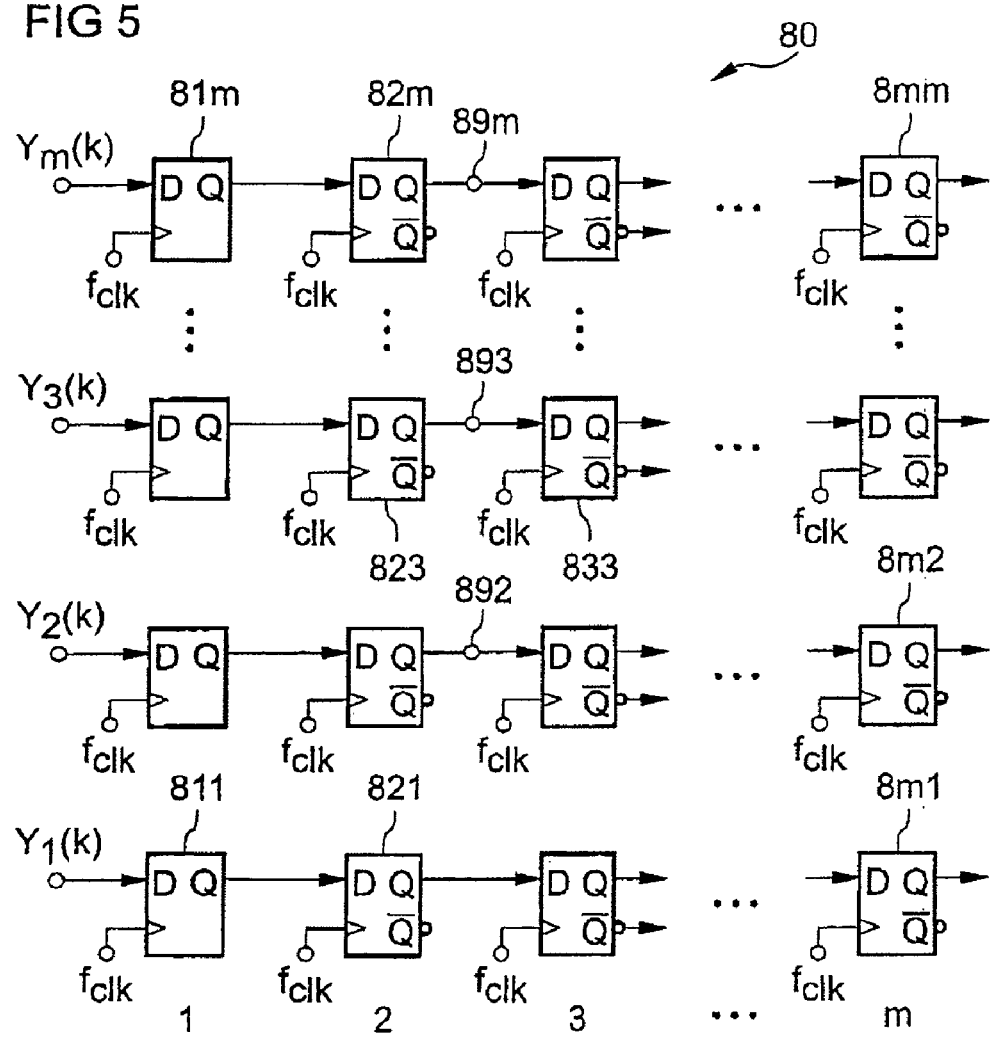

SIGMA-DELTA CONVERTER AND USE THEREOF

REFERENCE TO RELATED APPLICATIONS

This application claims the benefit of the priority date of German application DE 10 2005 029 819.2, filed on Jun. 27, 2005, the contents of which are herein incorporated by reference in their entirety.

FIELD OF THE INVENTION

The invention relates to a sigma-delta converter, particularly for radiofrequency applications. The invention also relates to a use for the sigma-delta converter.

BACKGROUND TO THE INVENTION

Sigma-delta converters, generally also called sigma-delta modulators or $\Sigma\Delta$ modulators, are used for many applications particularly in the field of analog-digital conversion. Another use is actuating regulatable frequency divider circuits in a phase locked loop. The use of a sigma-delta modulator for actuation in a phase locked loop is shown in prior art FIG. 9.

The phase locked loop shown contains a phase detector PD, with a charge pump CP connected to it, and also a voltage-controlled oscillator VCO. A return path in the phase locked loop contains a regulatable frequency divider :N which has its control input connected to a sigma-delta modulator $\Sigma\Delta$. The sigma-delta modulator $\Sigma\Delta$ takes a supplied digital data word F with a high bit length, for example a data word F with a length n of n=24 bits, and generates a time-altered representation of the data word with a much lower resolution, for example with a bit length n'=3.

The regulatable frequency divider can therefore switch to and fro between various divider values N, the middle divider value representing a value which corresponds to a word F which is supplied to the modulator and is a broken fraction. A sigma-delta converter can therefore also be understood to be an interpolator which delivers a digital output signal with a low bit resolution, said output signal representing an input signal with a high bit resolution.

To reduce the quantization noise and to increase the resolution, modern sigma-delta modulators have a pronounced noise shaping response. Prior art FIG. 8 shows a sigma-delta modulator with low quantization noise, which is achieved by cascading a plurality of series-connected individual modulator stages.

A cascaded sigma-delta modulator of this kind is also called a MASH modulator, for Multi Stage Noise Shaping modulator. The third-order MASH modulator shown in prior art FIG. 8 contains three series-connected individual modulator stages S1 to S3. In this case, each modulator stage has an accumulator A1 whose sum output s is fed back to an input b of the respective accumulator A1 via a flipflop F1. In addition, each accumulator in the individual modulator stages S1 to S3 has its output side connected to the input a of the accumulator A1 in the following stage.

The individual accumulators A1 in the three series-connected stages produce a sum from the data words supplied to their inputs a and b and output this sum at their outputs s. The individual accumulators have a processing width of $2^b$ bits, that is to say that the supplied data word has the bit length b. If the sum overflows, an overflow signal is produced at the overflow output c.

The overflow signal is supplied to a return path containing the summators E1 and E2. At their outputs, the two summators E1 and E2 output the 3-bit output signal Y(k). This may cover the value range –3, . . . , +4.

The output signal Y(k) from a third-order sigma-delta modulator can also be described mathematically by a sum for the individual output elements. Hence:

$$Y(k)=Y_1(k)+Y_2(k)*(1-k^{-1})+Y_3(k)*(1-k^{-1})^2$$

$$Y(k)=F(k)+E_3(k)*(1-k^{-1})^3$$

Here, $Y_1(k)$, $Y_2(k)$, $Y_3(k)$ denote the output signals from the first, second and third accumulator stages and $E_3(k)$ denotes the quantization error in the third modulator stage S3 of the sigma-delta modulator.

However, the sigma-delta modulator has only limited suitability for very rapid conversions or a high processing speed. The reason for this, inter alia, is that the known topology shown in prior art FIG. 9 results in a total delay time $\tau_{tot}$ which is made up of the sum of the delay times for the individual accumulators plus the sum of the delay times for the summators E1 and E2. The delay in the individual components is in turn a result of the manufacturing technology used. In principle, the maximum signal processing speed is thus limited to the total delay time for the modulator shown.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment of the invention, a sigma-delta converter comprises a signal input configured to receive a data word and a clock signal input for receiving a clock signal. The sigma-delta converter has a first clocked-operation accumulator stage whose input side is connected to the signal input. For the first accumulator stage, there is at least one series-connected second clocked-operation accumulator stage. This has its input side coupled to an accumulator output of the first accumulator stage. The first and second accumulator stages are configured to accumulate data words applied to the input side and to output them at an output. Finally, the sigma-delta converter is configured to process the data word upon each clock signal only in one accumulator stage in the first and the at least one second accumulator stage and to output the processed data word at the accumulator output of the one accumulator stage.

This embodiment largely reduces the problem of the time delay associated with the prior art, because the data word does not propagate through all the accumulator stages of the sigma-delta converter during signal processing, but rather through just one accumulator stage upon each clock signal. This advantageously reduces the total time delay to the delay of one accumulator stage. Consequently, signal processing in the inventive sigma-delta converter can be carried out much more rapidly, and therefore higher processing speeds can be achieved.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to the figures. Components which have the same function or action bear the same reference symbols.

FIG. 5 is a block/schematic diagram illustrating a general form of an output circuit for a sigma-delta converter according to an embodiment of the invention, FIGS. 6A and 6B illustrate the timing for supplied data words in a sigma-delta converter based on the invention and in a conventional sigma-delta modulator, respectively.

DETAILED DESCRIPTION OF THE INVENTION

Figure 1:
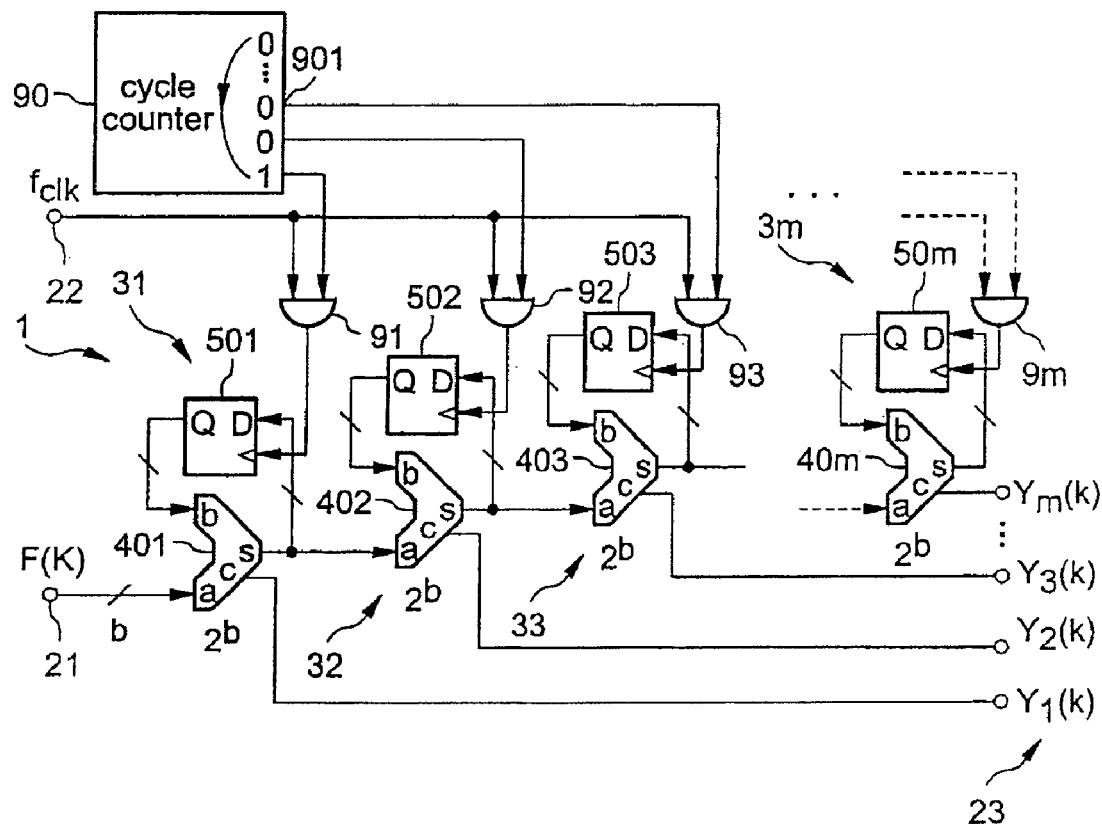
FIG. 1 is a block/schematic diagram illustrating an exemplary embodiment of the invention.
Figure 9:
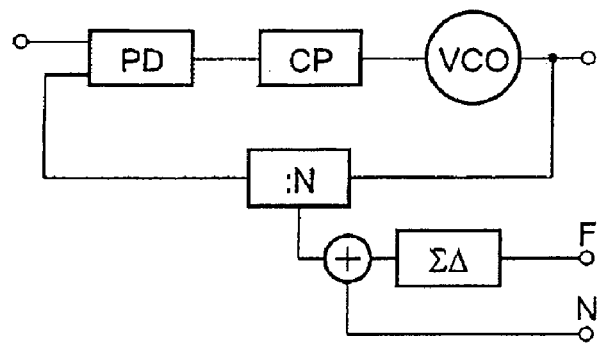
FIG. 9 is a block/schematic diagram illustrating a phase locked loop with a sigma-delta modulator.

FIG. 1 shows a sigma-delta converter in accordance with one embodiment of the invention. The converter shown here allows digital data words F(k) to be converted into output signals Y(k) at a processing speed of several 100 MHz. In this case, the sigma-delta converter can be implemented using modern manufacturing methods, for example, using CMOS architecture. It can thus readily be implemented in a semiconductor body as an integrated circuit. Its high signal processing speed allows the inventive sigma-delta converter to be used both as a digital converter and as an interpolator.

FIG. 1 shows a cascaded sigma-delta converter which comprises a number m of series-connected modulator stages 31, 32, . . . , 3m. Each individual modulator stage 31, 32, . . . , 3m contains a respective flipflop circuit 501, 502, . . . , 50m and a respective accumulator 401, 402, . . . , 40m.

The individual accumulators 401, 402, . . . , 40m respectively comprise a first input a, a second input b and a sum output s. The accumulators 401, 402, . . . , 40m form the sum of data words applied to the input side and output this sum at their sum output s. To this end, they are designed for processing data words of bit length b. If the supplied data word has a length of 10 bits, for example, the accumulators 401, 402, . . . , 40m can store values of $2^{10}$=1024. In the present exemplary embodiment, the accumulators have a bit width of 24 bits. It is therefore possible to supply data words which have values of 0, . . . , 16 777 216.

If the sum of the data words supplied to the inputs a and b returns a value of greater than $2^b$, for example greater than $2^{24}$, then the accumulators 401, 402, . . . , 40m produce an overflow signal which they output at their overflow output c. The corresponding overflow remainder is again stored as a sum and is again provided at the sum output s.

The output side of each of the accumulators 401, 402, . . . , 40m in the individual accumulator stages 31, 32, . . . , 3m is connected to a data input D of the associated flipflop circuit 501, 502, . . . , 50m. The data output Q of the flipflop circuit is again connected to the second input b of the respective accumulator 401, 402, . . . , 40m.

In one embodiment of the invention, the sigma-delta converter is configured to activate just one of the accumulator stages during a clock cycle, specifically that respective one in which signal processing is taking place. This additionally allows the power consumption of the whole sigma-delta converter to be reduced.

In one embodiment of the invention, the sigma-delta converter contains a control circuit whose input side is connected to the clock signal input of the sigma-delta converter. The control circuit is configured to cyclically actuate the first accumulator stage and the at least one second accumulator stage for cyclic signal processing and forward a data word supplied on the input side to the next accumulator stage in succession. In this embodiment of the invention, the control circuit addresses the individual accumulator stages cyclically upon each clock signal. Accordingly, just one accumulator stage is active and performs signal processing.

To actuate the individual accumulator stages 31, 32, . . . , 3m in the sigma-delta converter there is accordingly a control circuit 90. In this regard, the clock input of each flipflop circuit 501, 502, . . . , 50m of each accumulator stage is connected to the output of a logic AND gate 91, 92, . . . , 9m. A first input of the logic gates 91, 92, . . . , 9m is connected to the clock signal input 22 for the purpose of supplying the clock signal $f_{clk}$. The second input of each AND gate is connected to an output 901 of the control circuit 90. The input side of the control circuit is likewise coupled to the clock signal input 22.

In this exemplary embodiment, the control circuit 90 is in the form of a cyclic counter. Upon each clock signal $f_{clk}$ supplied on the input side, it produces an output-side clock signal which, as indicated, is supplied cyclically to the individual outputs 901. This also actuates the individual accumulator stages cyclically via the logic AND gates 91, 92, . . . , 9m.

Specifically, during operation the data word F(k) is supplied to the first accumulator stage 31 at the signal input 21. A clock signal at the clock input of the flipflop circuit 501 in the first accumulator stage 31 transfers this data word to the output Q and supplies it to the second input of the accumulator 401. The result of this at the output s of the accumulator is a sum which is supplied to the first input a of the accumulator 402 in the second stage 32.

Upon the next clock signal $f_{clk}$ at the clock signal input 22, the control circuit 90 now actuates the second accumulator stage 32 and the data word supplied on the input side is processed further. The overflow signals produced in the accumulators at the overflow outputs c are provided at the signal outputs 23.

While the sigma-delta converter of FIG. 1 is operating, the data word at the input F(k) propagates through a respective one of the individual accumulator stages upon each individual clock cycle. The time-critical processing within the individual accumulators in the accumulator stages is therefore reduced to the respective active accumulator. This embodiment additionally has the advantage that the power consumption of the whole sigma-delta converter is reduced, since only one accumulator stage is active per clock cycle.

In one embodiment of the invention, the first accumulator stage and the at least one second clocked-operation accumulator stage respectively comprise a flipflop circuit and an accumulator. The accumulator has a first input, a second input, an overflow output and a sum output. The sum output is connected to the second input of the accumulator via the respective one flipflop circuit of the accumulator stages. A clock input of the respective one flipflop circuit is coupled to the clock signal input of the sigma-delta converter for the purpose of actuating the flipflop circuit.

In one embodiment, the sum output of the first clocked-operation accumulator stage is connected to the first input of the at least one second accumulator stage. The clock signal input of the respective one flipflop circuit in the first and the second clocked-operation accumulator stage is respectively connected to the control unit. This refinement actuates the individual flipflop circuits in the first and the at least one second accumulator stage cyclically.

In an alternative embodiment, a data output of the flipflop circuit in the first clocked-operation accumulator stage is connected to the first input of the at least one second clocked-operation accumulator stage. This means that during operation the data word is forwarded to the next accumulator stage upon each clock cycle in this case too. A data word applied to the input is therefore processed upon each clock cycle just in one accumulator stage of the sigma-delta converter.

The time-shifted processing of a data word F(k) applied on the input side makes an additional output stage expedient, said output stage correcting this time-related processing.

The fact that a data word supplied on the input side is processed at different times means that it therefore makes sense to process the output signals from the individual modulator stages further in suitable fashion so as to correct a timing offset. In one embodiment of the invention, an output stage is therefore provided whose input side is coupled to the first accumulator stage and to the at least one second accumulator stage. Its output side couples it to a signal output for outputting a modulation word. The output stage is configured to correct a timing offset in the output signals from the individual accumulator stages.

In another embodiment, the output stage comprises a number of delay lines having series-connected delay elements. The number of delay lines corresponds to a number for the accumulator stages and the number of series-connected delay elements within a delay line likewise corresponds to the number of accumulator stages. The output stage accordingly comprises, in one example, a square matrix comprising individual series-connected delay elements, in which the number of elements in the matrix corresponds to a value which is obtained from the square of the order of the sigma-delta converter. In one embodiment of the invention, individual delay elements in the delay lines have taps between them which form a modulation output of the sigma-delta converter.

This embodiment advantageously provides a thermometer code as an output signal for the sigma-delta converter. The taps between the individual delay elements correspond, in terms of the number of their taps, to the individual coefficients which are obtained from the signal theory for a sigma-delta modulator of the same order.

Specifically, in one example a tap is located at the end of the delay line which is connected to the output of the first modulator stage. In addition, the delay line which is connected to an output of the second accumulator stage contains two taps, one of which is produced at the end of the delay line as an inverting tap. The second tap is provided between the last and the penultimate delay element in this delay line.

FIG. 5 shows one example of an output stage of this kind in the form of a matrix comprising a plurality of delay elements. In addition, the embodiment shown here has the advantage that suitable interconnection and a suitable choice of taps allow the return path of known sigma-delta modulators to be dispensed with. This additionally allows a further speed advantage to be achieved. The output stage 80 shown in FIG. 5 example contains an m×m matrix comprising series-connected D-type flipflop circuits.

To this end, the data inputs of the respective first D-type flipflop circuits are, in this example, connected to the corresponding outputs 23 for supplying the overflow signals $Y_1(k), Y_2(k), \ldots, Y_m(k)$ from the individual modulator stages 31, 32, . . . , 3m. The data outputs are respectively connected to the data inputs of the subsequent D-type flipflops. In addition, taps 892, 893, . . . , 89m are provided between some flipflops. The taps in the output circuit 80 are in this case chosen such that they correspond to a functionality of a return path in a known sigma-delta modulator and advantageously represent a thermometer code for the output signal which is output by the modulator. However, this arrangement contains only delay elements which are themselves designed for rapid signal processing. The design and choice of the taps will be clarified below.

The following is obtained for the output signal $Y_1(k)$ from the first accumulator stage 31 in the sigma-delta modulator:

$$Y_1(k)=F(k)+E_1(k)*(1-z^{-1})$$

Here, F(k) is the supplied data word at the input a of the accumulator 401 in the first accumulator stage and $E_1$ is the quantization noise in the respective accumulator stage. The quantization noise $E_1(k)$, which is an error signal, is supplied to the respective subsequent accumulator stages as a further input signal. Accordingly, the following applies for the output signals $Y_2(k)$ and $Y_3(k)$ for the accumulator stages 32 and 33:

$$Y_2(k)=-E_1(k)+E_2(k)*(1-z^{-1})$$

$$Y_3(k)=-E_2(k)+E_3(k)*(1-z^{-1})$$

For the total sum signal Y(k), it follows for a cascaded sigma-delta modulator that:

$$Y(k)=Y_1(k)+Y_2(k)*(1-z^{-1})+Y_3(k)*(1-z^{-1})^2+\ldots+Y_m(k)*(1-z^{-1})^{m-1}$$

$$Y(k)=F(k)+E_m(k)*(1-z^{-1})^m$$

The taps 892, 893, . . . , 89m in the output circuit shown in FIG. 5 are obtained from the multiplication coefficients for the individual terms $Y_1(k), Y_2(k) \ldots, Y_m(k)$ in the above polynomial for Y(k).

Figure 3:
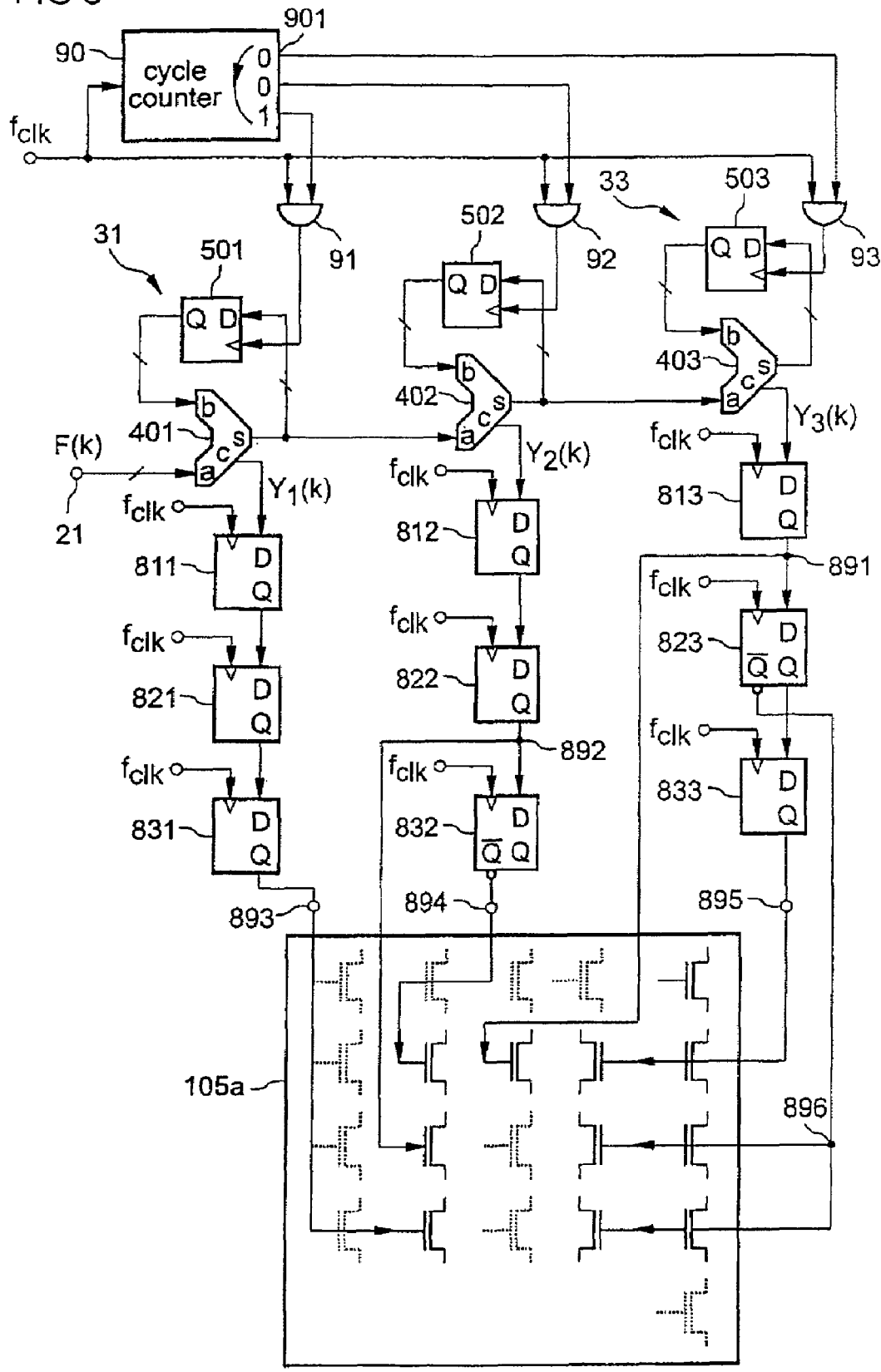
FIG. 3 is a block/schematic diagram illustrating a third-order sigma-delta converter based on the exemplary embodiment of FIG. 1.

FIG. 3 shows an instance of application of this exemplary embodiment with an output circuit for a third-order sigma-delta converter. This can be used to clarify the design of the taps and their relationship with the binomial coefficients for the individual components $Y_1$, $Y_2$ and $Y_3$. In the exemplary embodiment shown here, the signals from the output taps are used for directly actuating a transistor matrix. The totality of the signals in the individual output taps denotes a "thermometer code", which represents a different representation of a particular value and can easily be converted into the corresponding binary code. The thermometer code is supplied to a switching matrix 105*a* which has a number of field effect transistors. These have their control connections coupled to the taps.

The overflow outputs c of the individual accumulators 401, 402 and 403 are connected to the data inputs 811, 812 and 813. The data outputs Q of the flipflop circuits 811, 812, 813 are for their part connected to the data inputs D of the flipflops 821, 822 and 823. These flipflops have their output side in turn connected to the flipflops 831, ..., 833. The flipflop circuits are delay elements and form the output stage 80. They represent a combinational network comprising a 3×3 matrix flipflop circuit. In addition, the taps 891, ..., 896 are provided.

For the output signal Y(k) from a cascaded sigma-delta modulator, the following is obtained:

$$Y(k)=Y_1(k)+Y_2(k)*(1-z^{-1})+Y_3(k)*(1-z^{-1})^2$$

$$Y(k)=Y_1(k)*1+Y_2(k)*(1-z^{-1})+Y_3(k)*(1-2z^{-1}+z^{-2})$$

The coefficients of this polynomial Y(k) for the individual terms $Y_1$, $Y_2$ and $Y_3$ determine the taps in the output circuit and in the network. Hence, in this embodiment, the coefficients (+1, +1 −1, +1 −2 +1) are obtained for a third-order modulator. This gives the tap 893, which represents the coefficient +1 for the output signal $Y_1(k)$ from the first modulator stage. The coefficient +1 for the second term is formed by the tap 892. The second coefficient −1 for the second term $Y_2(k)$ is given by the inverting output $\overline{Q}$ of the last flipflop 832. Accordingly, the taps 891, 896 and 895 determine the coefficients +1 −2 and +1 for the third summand $Y_3(k)$. The additional multiplication factor in the coefficient −2 is obtained, as illustrated, through the split shown in the tap 896.

The use of the combinational network shown in FIG. 5 as an output circuit for the individual signals $Y_1(k)$ to $Y_m(k)$ therefore allows an appropriate thermometer code to be provided without using additional summators in the return path. In this case, the taps to be used are obtained from the binomial coefficients for the terms $(1-z^{-1})^n$, with n assuming values from 0 to m. Generally, the following applies to these terms:

$$(1-z^{-1})^n = \sum_{l=0}^{n} \binom{n}{l} 1^{n-k} z^{-k},$$

where the brackets are the binomial coefficient. The values of the binomial coefficients and hence the location and also the number of taps in the switching matrix 80 can thus be read off for any desired order of the sigma-delta converter. The time delay on account of the summation of the individual output signals in the return path therefore disappears. The sigma-delta converter based on the invention can be operated at much higher clock frequencies $f_{clk}$ using the combinational network.

Figure 2:
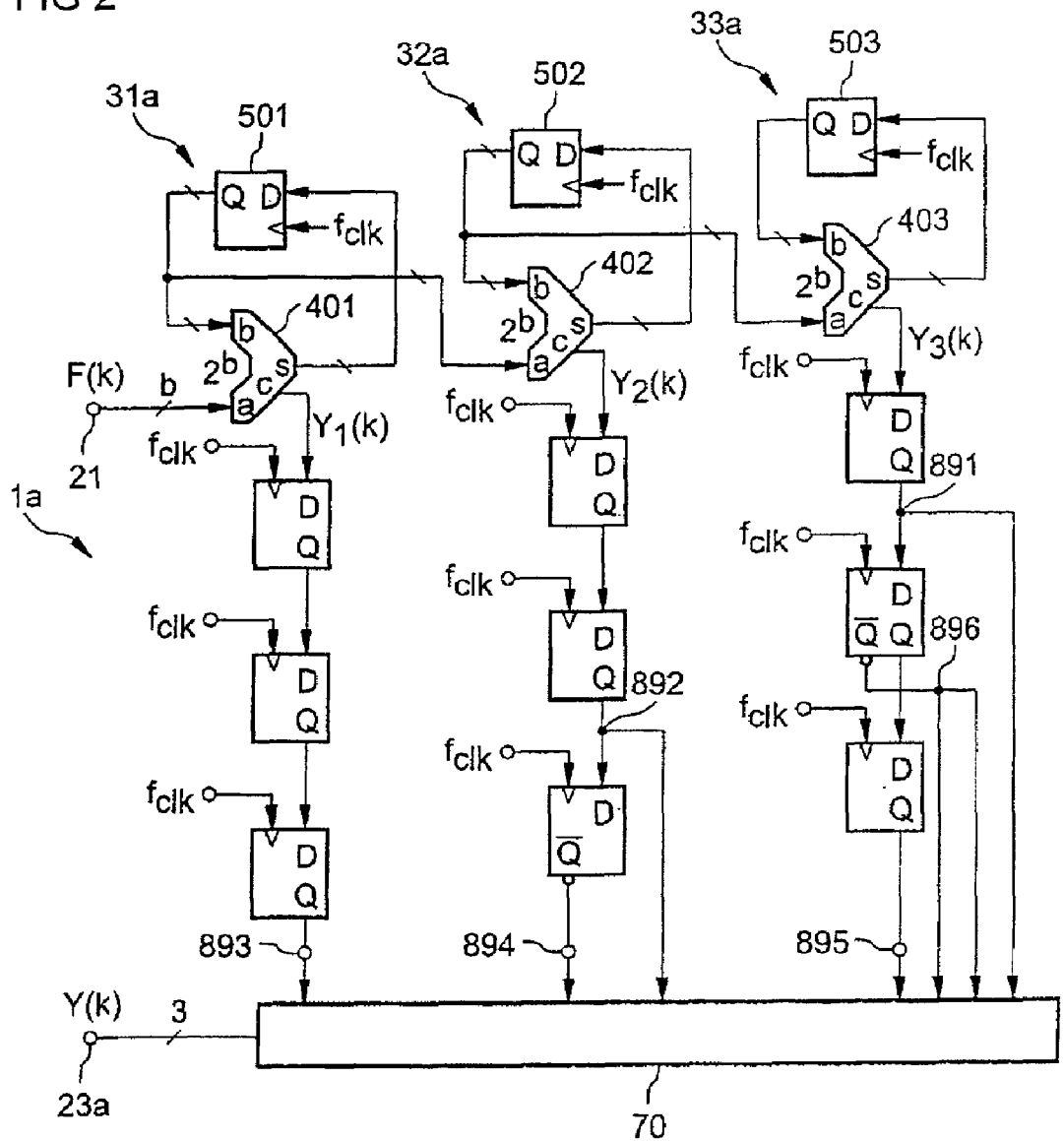
FIG. 2 is a block/schematic diagram illustrating another exemplary embodiment of the invention.

FIG. 2 shows a further embodiment of the invention of the sigma-delta converter with a downstream combinational network and also a decoder circuit 70 for providing a discrete-value output signal Y(k). Components which have the same function or action bear the same reference symbols.

In this embodiment, the sigma-delta converter is in the form of a third-order modulator. Without limiting the general nature, it is naturally possible to provide or omit further individual modulator stages and thus to raise or lower the order of the inventive sigma-delta modulator. In this embodiment too, provision is made for the data word F(k) supplied on the input side, with bit length b, to be processed upon each clock cycle of the clock signal $f_{clk}$ merely in one accumulator stage. For this purpose, the sum outputs s of the accumulators 401, 402 and 403 in each accumulator stage 31*a*, ..., 33*a* are connected merely to the data inputs D of the flipflops 501, 502 and 503.

The data output Q of the flipflop 501 is connected to the second input b of the accumulator 401. In addition, the data output Q of the flipflops 501 is also connected to the first input a of the accumulator 402 in the second accumulator stage 32*a*. Accordingly, the data output Q of the flipflop 502 in the second accumulator stage 32*a* is connected both to the second input b of the accumulator 402 and to the first input a of the accumulator 403 in the third accumulator stage 33*a*. During operation, the data word processed in an accumulator stage 401 is accordingly transferred to the subsequent accumulator stage upon each pulse of the clock signal $f_{clk}$. The data word F(k) supplied on the input side therefore propagates through the individual modulator stages upon each clock cycle, with s being processed merely in one modulator stage per clock cycle.

In this case too, the overflow outputs c with the output signals $Y_1(k)$, $Y_2(k)$ and $Y_3(k)$ are connected to the data inputs D of the first flipflops 811, 812 and 813 in the combinational network 80. The corresponding taps 891, ..., 896 in the combinational network are in this case connected to a decoder circuit 70. The signals which are output by the combinational network 80 represent a thermometer code for the output signal Y(k). The thermometer code is converted into the corresponding binary code again in the decoder circuit 70 and is provided as a digital control word having a length of 3 bits and a value range from −3 to +4 as output word Y(k) at the output 23*a*.

Figure 8:
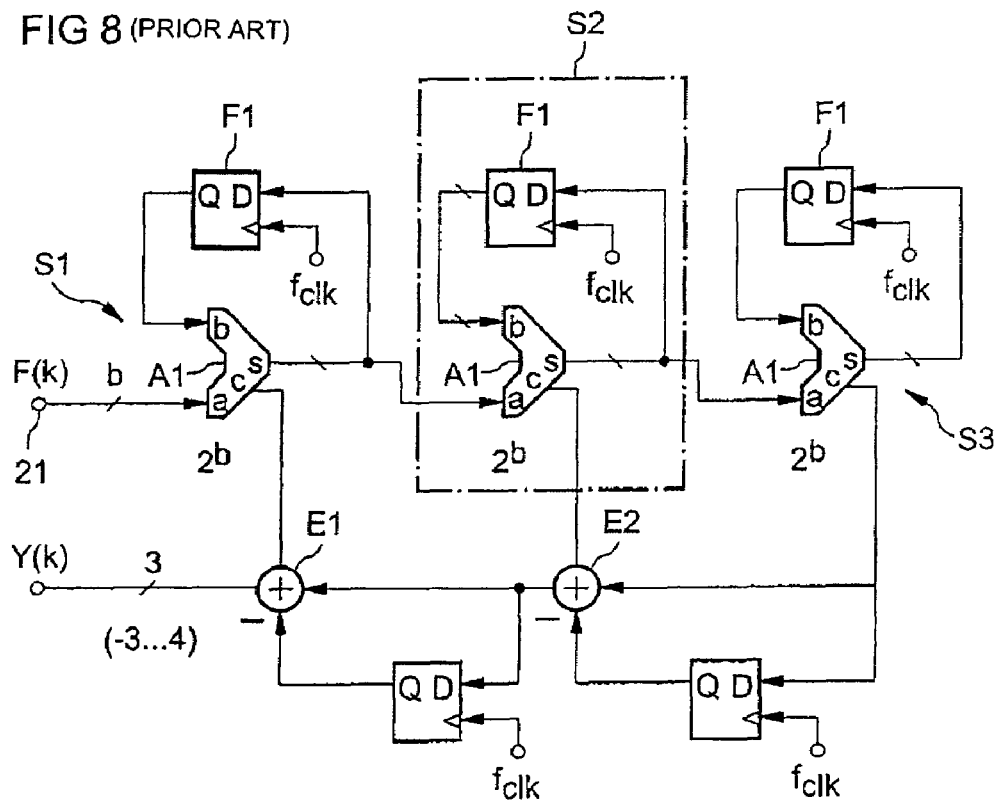
FIG. 8 is a block/schematic diagram illustrating a conventional sigma-delta modulator.

FIGS. 6A and 6B show the timing for a data word over a plurality of clock cycles in the accumulator stages shown here in the third-order sigma-delta converter. In this case, the new inventive architecture based on the exemplary embodiment in FIG. 2 is compared in FIG. 6A with the timing for a data word in a conventional modulator from FIG. 8 in FIG. 6B.

To clarify, the supplied data word F(k) is constant over the period of 5 clock cycles under consideration and has the value 524. FIG. 6B shows that the data word F(k) supplied on the input side propagates through all the modulator stages of the known sigma-delta modulator upon each clock cycle. Hence, the sum signal in FIG. 6B is the same in each modulator stage after the first clock cycle.

In the second clock cycle, an overflow signal c is produced in the first stage S1 and in the third stage S3, said overflow signal being indicated by the vertical line. At the same time, it can be seen that during this clock cycle each modulator stage also needs to process the result from the preceding modulator stage. Thus, the sum in the first modulator stage returns the value 24, which produces the value 548 in the second stage as the result. This means that additional time delays in the preceding modulator stages may result in errors.

By contrast, the converter of the present invention merely has processing carried out in one modulator stage. This brings about a time delay for the processing in the subsequent modulator stages, which is indicated here by arrows. The data word F(k) is thus processed in the first clock cycle 1 merely by the first modulator stage 31*a*.

The two further modulator stages 32*a* and 33*a* also contain the value 0. The data word is forwarded to the subsequent modulator stage 32a in the second clock cycle and is processed by it. The time shift of processing the supplied data word F(k) is compensated for again by the combinational network and the suitable choice of taps. At the same time, the time demands on the processing are reduced too. The sigma-delta converter illustrated is therefore also suitable for higher processing frequencies.

Figure 7:
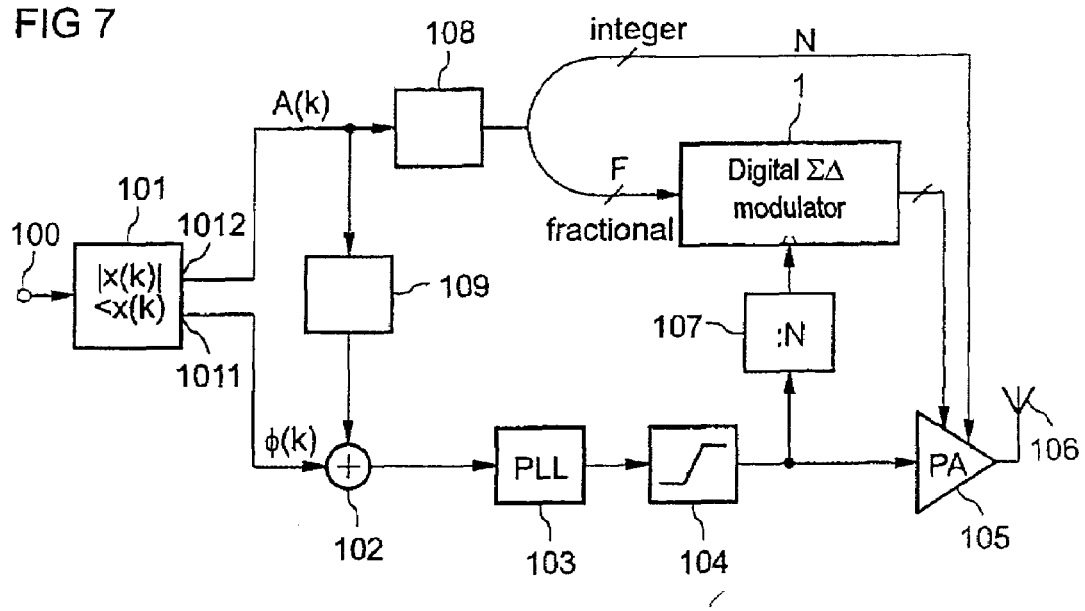
FIG. 7 is a block diagram illustrating a use for the sigma-delta converter in a polar modulator according to an embodiment of the invention.

FIG. 7 shows an exemplary embodiment of an application for a sigma-delta modulator based on the invention. The figure shows a block diagram of a digital polar transmitter in which the amplitude modulation component is used for modulating the supply voltage or the supply current for an output power amplifier 105. Depending on the modulation method and data transmission rate used, it is necessary to achieve high amplitude modulation speeds. The digital polar transmitter contains a decoder circuit 101 which splits the symbols supplied at the input 100 into their amplitude component and their phase component and supplies the amplitude and phase to the further signal processing.

To improve the response characteristic and reduce possible distortion, a predistortion unit 109 is provided. This has its input side connected to the output 1012 of the decoder unit 101. It evaluates the amplitude modulation signal A(k) and from this ascertains suitable predistortion coefficients for the phase modulation signal Φ(k). The predistortion coefficients are added to the phase modulation signal using the summator 102. The phase modulation signal predistorted in this manner is then fed into a phase locked loop 103, whose output side is connected to a limiting amplifier 104. The predistortion compensates for a nonlinear response characteristic in downstream assemblies, particularly in amplifiers, and thus improves the signal quality overall.

In addition, the unit 108 is used to perform amplitude predistortion. This reduces a possible nonlinear signal response characteristic in the output amplifier 105. The predistortion unit 108 for the amplitude predistortion produces an integer component N and also a fractional component F and outputs these at its output 1081. The integer component N is applied directly to the power amplifier 105 in order to set its power. The fractional component F is supplied to the inventive digital sigma-delta converter 1. As a clock signal, the sigma-delta modulator contains a clock signal which has been conditioned by means of the divider circuit 107. This signal is derived from the already phase-modulated carrier signal. To this end, the divider circuit 107 has its input side connected to the output of a limiting amplifier 104. From the fractional component F supplied, the sigma-delta converter produces a thermometer code and outputs it to the power amplifier in order to set its output power.

Figure 4:
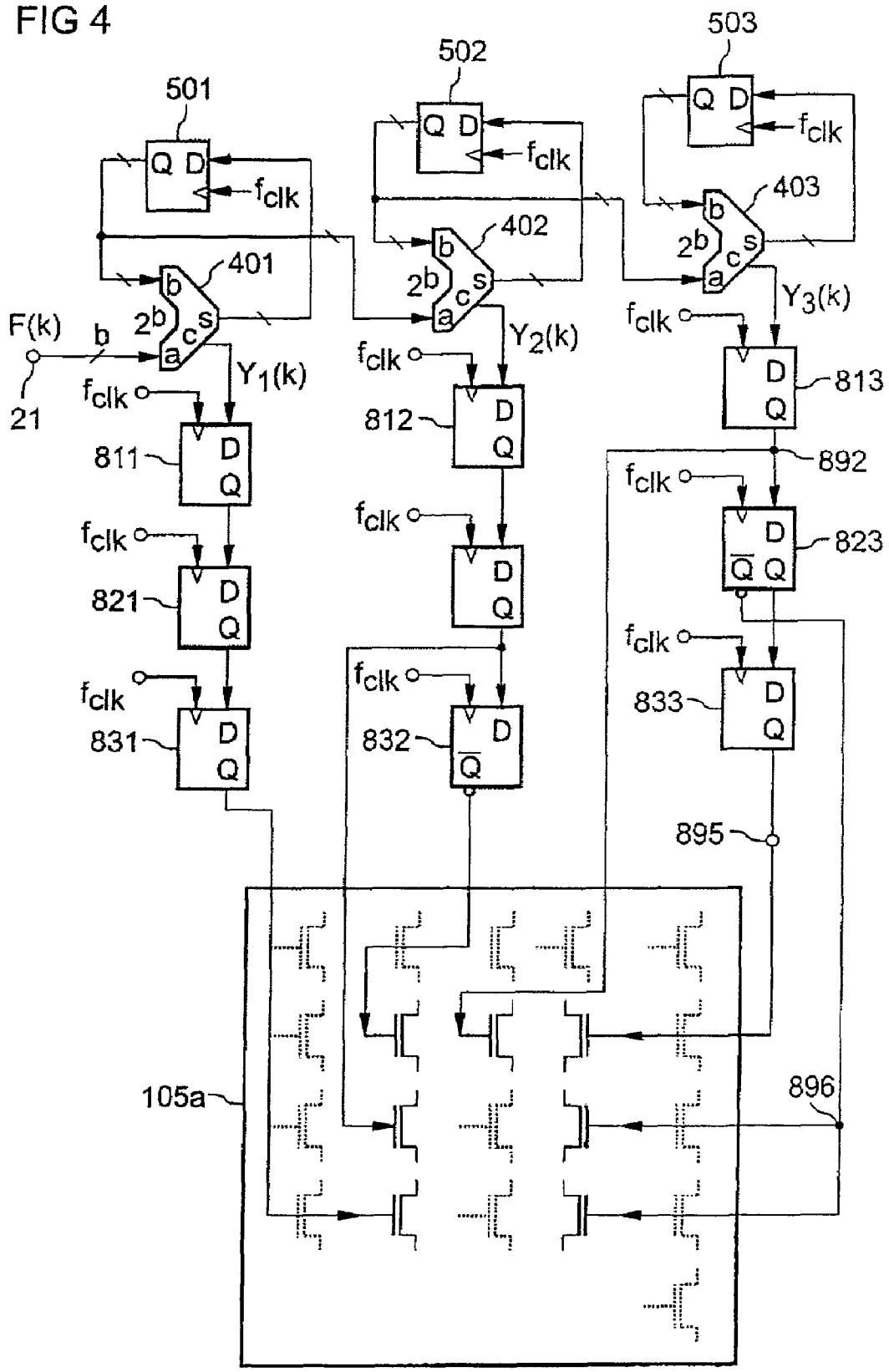
FIG. 4 is a block/schematic diagram illustrating an instance of application of the exemplary embodiment based on FIG. 2.

FIG. 4 shows an application for an interconnection of this type. In this case, the taps 891, . . . , 896 are connected to a switching matrix 105a comprising various transistors in order to provide the thermometer code. The individual transistors are, as shown here, actuated by the signals in the combinational network 80. The transistor matrix 105a shown is in turn used to alter the supply voltage or the supply current in the power amplifier 105 and hence to regulate the output level, which achieves amplitude modulation.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A sigma-delta converter, comprising:
   a signal input configured to receive a data word;
   a clock signal input configured to receive a clock signal;
   a signal output configured to output a modulation signal;
   a first clocked-operation accumulator stage comprising an accumulator output, and comprising an accumulator input connected to the signal input; and
   at least one second clocked-operation accumulator stage connected in series with the first accumulator stage, comprising an accumulator output and an accumulator input coupled to the accumulator output of the first accumulator stage;
   wherein the sigma-delta converter is configured to process the data word upon each clock signal only in one accumulator stage of the first and at least one second accumulator stage, and further configured to output the processed data word at the accumulator output of the one accumulator stage.

2. The sigma-delta converter of claim 1, further comprising a control circuit configured to effectuate a cyclic actuation of the first and the at least one second accumulator stage, wherein the cyclic actuation cyclically processes the data word such that respectively just one of the first and at least one second accumulator stage is active.

3. The sigma-delta converter of claim 1, further comprising:
   an output stage comprising an input side coupled to the signal output, wherein the output stage is configured to output an output word based on the modulation signal, with the modulation signal indicating an overflow in the first and at least one second accumulator stage.

4. The sigma-delta converter of claim 3, wherein the output stage comprises a plurality of delay lines comprising series-connected delay elements, where the number of delay lines and the number of series-connected delay elements in at least one delay line correspond to a number of accumulator stages.

5. The sigma-delta converter of claim 4, wherein the delay elements in the plurality of delay lines have taps between them that collectively form a modulation output of the sigma-delta converter, thereby outputting a modulation word.

6. The sigma-delta converter of claim 5, wherein the taps are provided at the output of the respective last delay element in each delay line.

7. The sigma-delta converter of claim 5, wherein the number of taps and the position of the taps in a delay line are obtained from values of the binomial coefficients for an order of the sigma-delta converter.

8. The sigma-delta converter of claim 4, wherein the delay elements comprise D-type flipflop circuits.

9. The sigma-delta converter of claim 1, further comprising:
a control circuit comprising an input side connected to the clock signal input, wherein the control circuit is configured to cyclically actuate the first and at least one second accumulator stage for signal processing.

10. The sigma-delta converter of claim 1, wherein the first and the at least one second clocked-operation accumulator stage respectively comprise a flipflop circuit and an accumulator which comprises a first input, a second input, an overflow output, and a sum output, wherein the sum output is connected to the second input, via the respective one flipflop circuit, and a clock input of the respective one flipflop circuit is coupled to the clock signal input, for the purpose of actuating the flipflop circuit.

11. The sigma-delta converter of claim 10, wherein the sum output of the accumulator in the first clocked-operation accumulator stage is connected to the first input of the accumulator in the at least one second accumulator stage, and a clock input of the respective one flipflop circuit is coupled to the control unit for the purpose of actuating the flipflop circuit.

12. The sigma-delta converter of claim 10, wherein a data output of the respective one flipflop circuit in the first accumulator stage is connected to the first input of the accumulator in the at least one second accumulator stage.

13. A sigma-delta converter, comprising:

a signal input configured to receive a data word;

a signal output configured to output a modulation signal;

first accumulation means for processing the data word in clocked fashion;

at least one second accumulation means for processing the data word processed in the first means in clocked fashion;

control means for cyclically actuating the first and the at least one second accumulation means based on a clock signal for carrying out signal processing such that the data word is processed respectively only in one of the first and the at least one second accumulation means for a given clock signal period.

14. The sigma-delta converter of claim 13, further comprising means for deriving an output word from a modulation signal, the modulation signal indicating an overflow in the first and at least one second accumulation means.

15. The sigma-delta converter of claim 14, wherein the derivation means comprises a plurality of delay lines comprising series-connected delay elements, wherein a number of delay lines and a number of delay elements in at least one delay line is dependent on a number of the accumulation means.

* * * * *